United States Patent [19]
Baylor et al.

[11] Patent Number: 5,892,231
[45] Date of Patent: Apr. 6, 1999

[54] VIRTUAL MASK DIGITAL ELECTRON BEAM LITHOGRAPHY

[75] Inventors: Larry R. Baylor, Farragut; Clarence E. Thomas, Knoxville; Edgar Voelkl, Oak Ridge; James A. Moore, Powell; Michael L. Simpson; Michael J. Paulus, both of Knoxville, all of Tenn.

[73] Assignee: Lockheed Martin Energy Research Corporation, Oakridge, Tenn.

[21] Appl. No.: 795,003

[22] Filed: Feb. 5, 1997

[51] Int. Cl.⁶ ...................................................... H01J 37/30
[52] U.S. Cl. ........................................ 250/398; 250/423 F
[58] Field of Search ............................... 250/396 R, 398, 250/423 F; 313/336

[56] References Cited

U.S. PATENT DOCUMENTS

| | | | |
|---|---|---|---|
| 3,665,241 | 5/1972 | Spindt et al. | 313/351 |
| 4,130,761 | 12/1978 | Matsuda | 250/398 |
| 4,409,487 | 10/1983 | Kuschel et al. | 250/398 |
| 4,724,328 | 2/1988 | Lischke | 250/398 |
| 4,731,537 | 3/1988 | Williams et al. | 250/396 |
| 4,742,234 | 5/1988 | Feldman et al. | 250/398 |
| 4,798,959 | 1/1989 | Marks | 250/492.2 |
| 4,902,898 | 2/1990 | Jones et al. | 250/492.2 |
| 4,980,567 | 12/1990 | Yasusa et al. | 250/396 R |
| 5,126,574 | 6/1992 | Gallagher | 250/492.2 |
| 5,138,237 | 8/1992 | Kane et al. | 315/349 |
| 5,363,021 | 11/1994 | MacDonald | 250/398 |
| 5,384,463 | 1/1995 | Honjo et al. | 250/396 R |
| 5,514,847 | 5/1996 | Makishima et al. | 250/423 F |
| 5,723,867 | 3/1998 | Impra | 250/423 F |

FOREIGN PATENT DOCUMENTS

| | | | |
|---|---|---|---|
| 0 289 278 A2 | 11/1988 | European Pat. Off. | H01J 37/073 |
| 0 780 879 A2 | 6/1997 | European Pat. Off. | H01J 37/317 |
| 196 38 109 A1 | 3/1997 | Germany | H01J 37/317 |

OTHER PUBLICATIONS

Shimazu, N. et al., "Electron Beam System EB60 Permits Fast Direct Drawing on Wafers", JEE Journal of Electronic Engineering, vol. 23, No. 238, pp. 85–88, Oct. 1, 1986.

Chang, T. et al., "Arrayed miniature electron beam columns for high throughput sub–100nm lithography", J. Vac. Sci. Technol., Part B, vol. 10, No. 6, pp. 2743–2748, Nov. 1992.

Stebler, C. et al., "Miniaturized e–Beam Writer: Testing of Components", Microelectronic Engineering, vol. 27, No. 1/04, pp. 155–158, Feb. 1995.

Primary Examiner—Bruce Anderson
Attorney, Agent, or Firm—Wilson, Sonsini, Goodrich & Rosati

[57] ABSTRACT

Systems and methods for direct-to-digital holography are described. An apparatus includes a laser; a beamsplitter optically coupled to the laser; a reference beam mirror optically coupled to the beamsplitter; an object optically coupled to the beamsplitter, a focusing lens optically coupled to both the reference beam mirror and the object; and a digital recorder optically coupled to the focusing lens. A reference beam is incident upon the reference beam mirror at a non-normal angle, and the reference beam and an object beam are focused by the focusing lens at a focal plane of the digital recorder to form an image. The systems and methods provide advantages in that computer assisted holographic measurements can be made.

20 Claims, 3 Drawing Sheets

VIRTUAL MASK DIGITAL ELECTRON BEAM LITHOGRAPHY

STATEMENT AS TO RIGHTS TO INVENTIONS MADE UNDER FEDERALLY-SPONSORED RESEARCH AND DEVELOPMENT

The U.S. Government has a paid-up license in this invention and the right in limited circumstances to require the patent owner to license others on reasonable terms as provided for by the terms of No. DE-AC05-96OR22464 awarded by the Department of Energy.

BACKGROUND OF THE INVENTION

1. Field of the Invention

The present invention relates generally to the field of electron (i.e., β radiation) beams. More particularly, the present invention relates to an addressable field emitter array that produces a spatially modulated electron beam matrix. Specifically, a preferred implementation of the present invention relates to a digitally addressable field emitter array in combination with an electrostatic acceleration grid and a magnetic lens assembly that includes a telecentric magnetic lens system and a correction lens system which together de-magnify the spatially modulated electron beam matrix onto a target wafer so as to directly write an electron resist with minimal distortion. The present invention thus relates to an addressable field emitter array of the type that can be termed lithographic.

2. Discussion of the Related Art

Within this application several publications are referenced by arabic numerals within parentheses. Full citations for these, and other, publications may be found at the end of the specification immediately preceding the claims. The disclosures of all these publications in their entireties are hereby expressly incorporated by reference into the present application for the purposes of indicating the background of the present invention and illustrating the state of the art.

Historically, optical lithography for semiconductor wafer production has been limited in resolution by the wavelength of the light source being used. At any particular wavelength of light, diffraction limits the focusability of an optical beam to a circle of a diameter approximately equal to the wavelength of the light source. Consequently, the fabrication industry has evolved several generations of lithographic light sources, each using a shorter wavelength than its predecessors. As microelectronic features have continued to shrink, the resolution of optical lithography is now a barrier to further increasing the density of chip features because suitable light sources of still shorter wavelength are no longer readily available. What is needed therefore is a way to increase the resolution of lithography.

A previously recognized solution has been to use an electron beam to expose an electron resist that has been coated on the surface of a semiconductor wafer, thereby enabling a pattern to be etched into the surface of the wafer through apertures formed in the subsequently developed resist. Electron beam technology is already a strong candidate for lithographically producing semiconductor devices with line widths on the order of approximately 0.1 micron. Electron beam imaging resolutions on the order of approximately 80 Å have been previously reported.[2]

Prior art electron beam devices of the type hereunder consideration, sometimes called electron guns, are well-known to those skilled in the art. A conventional electron beam is typically generated in a vacuum by electrical resistance heating of a suitable material to generate a stream of electrons. This stream of electrons is then electrostatically and/or magnetically focused. Two specific prior art electron beam devices are the cathode ray tube (CRT) and the scanning electron microscope (SEM), both of which generate and focus a beam of electrons in a vacuum.

For example, referring to FIG. 1, a conventional CRT electron gun with a bipotential lens structure is shown where an electron beam 110 is incident a screen 120 at a potential $V_s$.[1] This conventional electron gun includes a cathode 130 and a first apertured grid 140 which is maintained negative with respect to the cathode and controls the flow of electrons from the cathode. A second apertured grid 150 is located downstream of a cross over point and set at a positive voltage with respect to the cathode 130 so as to attract the electrons and shape the beam 110. A focus electrode 160 focuses the beam 110. The resolution can be improved by using an electromagnetic focus instead of the focus electrode 160.

Referring now to FIG. 2, the principle of electromagnetic deflection of an electron beam is illustrated where a flux of electrons 210 is incident a screen 220 at a deflection amplitude. An electromagnetic deflection coil 230 is composed of two perpendicular windings generating electromagnetic field perpendicular to the trajectory of the electron beam in the vertical and horizontal planes. A field of length l is applied perpendicularly to the flux of electrons 210 which have previously been accelerated to a velocity $V_B$. The flux of electrons 210, assuming the field intensity is uniform and of length l, is deflected onto a circular path of radius r. The corresponding angle of deflection is θ such that $$\sin\theta = Ni(l)/2.68D \sqrt{V_B}$$

where Ni is the number of ampere turns generating the magnetic field, D is the diameter of the cylindrical winding generating the field, l is the length of the field and $V_B$ is the accelerating voltage expressed in volts.

Although the electrons in the beams generated by the prior art electron beam devices have a wavelength, and a corresponding resolution limit that is imposed by diffraction, as a practical matter, the electron wavelength is so short that the diffraction of the electrons does not limit the resolution of the electron beam. This is because the prior art electron beam systems all include electrostatic lenses and/or magnetic lenses that generate stray fields. These stray fields are electromagnetic aberrations that result in distortions of the shape of the electron beam of a size that is at least on the order of nanometers. These distortions are larger than the wavelength of the electrons. Thus, the electromagnetic aberrations of the prior art devices limit the maximum resolution of the beam before the theoretical diffraction limit becomes an issue. Therefore, what is also needed is a way to reduce the effect of electromagnetic aberrations of the resolution of electron beam lithography.

Moreover, in the past, electron resist imaging has been relatively inefficient because the prior art electron beams have merely illuminated a single area and have had to be methodically scanned to write any sort of pattern. For example, referring to FIG. 3, a conventional fixed electron beam 310 is shown being truncated by a beam-shaping mask 320. Mask 320 includes a square shaped aperture. The mask 320 functions as a β radiation shield and gives the electron beam a square cross-section which is more useful for exposure of an electron resist. The square beam is then shaped by a lens 330 and subsequently deflected by a scanning deflector 340 before striking a target wafer 350 on which an electron resist is coated.

Still referring to FIG. 3, to scan the illustrated T-shaped pattern, either the electron beam must be scanned by the operation of the scanning deflector 340, or the target wafer 350 must be moved. In any event, this requires a large amount of time to image the design of even a simple integrated circuit (IC). As the complexity of integrated circuits (ICs) increase, more demanding semiconductor circuit design rules require correspondingly smaller electron beam spot sizes. And the smaller the spot size, the more time is required to complete the scanning of a given pattern. Thus, electron beam lithography has heretofore been slow, and therefore expensive. Therefore, what is also needed, is an electron resist writing method having higher efficiency.

Still referring to FIG. 3, another problem with electron beam lithography has been that using a truncated electron beam involves the use of the mask 320 which absorbs significant energy from the screened electron flux. The thermal management of the mask 320 is problematic. This has prevented the use of any but the most simple shielding masks because masks with almost any degree of detail rapidly deform and melt due to their function as β radiation shields. This problem is exacerbated by the fact that as higher energy electrons having shorter wavelengths are used, the thermal energy that needs to be dissipated also increases. Therefore, what is also needed is a way to tailor the cross-section of an electron beam without using a mask.

The below-referenced U.S. patents disclose embodiments that were satisfactory for the purposes for which they were intended. The disclosures of both the below-referenced prior U.S. patents, in their entireties are hereby expressly incorporated by reference into the present application for purposes including, but not limited to, indicating the background of the present invention and illustrating the state of the art.

U.S. Pat. No. 3,665,241 discloses a field ionizer and field emission cathode structures and methods of production. U.S. Pat. No. 5,363,021 discloses a massively parallel array cathode.

SUMMARY AND OBJECTS OF THE INVENTION

By way of summary, the present invention is directed to a digitally addressable field emitter array (e.g., a spatially modulated β radiation source) The array can be combined with a magnetic lens assembly including a telecentric magnetic lens system and a correction magnetic lens system which together de-magnify the field emitted beam array onto a target wafer for direct exposure of an electron resist. By additionally providing a relatively high electrostatic accelerating field prior to the lens assembly, the affect of aberrations caused by stray magnetic fields from the lens assembly can be minimized. An unexpected beneficial effect of the present invention, which is a substantial improvement, is to provide a low distortion flexible manufacturing tool that can function as a reprogrammable virtual mask.

A primary object of the invention is to provide an apparatus that produces a digitally addressable array of electron beams (electron beam matrix). Another object of the invention is to provide an apparatus than can magnetically de-magnify the electron beam matrix with a magnetic lens assembly while minimizing the affect of distortions in the matrix from aberrations due to the lens assembly. Another object of the invention is provide an apparatus that can fill target wafer pixels by deflecting the matrix. Another object of the invention is to provide an apparatus that is cost effective. It is another object of the invention to provide an apparatus that is rugged and reliable, thereby decreasing down time and operating costs. It is yet another object of the invention to provide an apparatus that has one or more of the characteristics discussed above but which is relatively simple to manufacture and assemble using a minimum amount of equipment.

In accordance with a first aspect of the invention, these objects are achieved by providing a digital direct write electron beam lithography system, comprising: I) a digitally addressable field emission array including: A) a digital computer interface; B) a plurality of field emitters electrically connected to said digital computer interface; and C) an electrostatic bias grid operably connected to said plurality of field emitters; II) an electrostatic accelerator grid operably connected to said addressable field emission array; III) a magnetic lens assembly operably connected to said electrostatic accelerator grid, said magnetic lens assembly including: A) a telecentric magnetic lens system; and B) a correction magnetic lens system; and IV) a set of electrostatic deflection plates operably connected to said magnetic lens assembly. In one embodiment, the matrix system further comprises V) a target wafer electronically coupled to said plurality of field emitters through all of said electrostatic accelerator grid, said magnetic lens assembly and said set of electrostatic deflection plates.

Another object of the invention is to provide a method that can be used to directly write an electron resist with a pattern in a short period of time; without a mask. It is another object of the invention to provide a method that is predictable and reproducible, thereby decreasing variance and operating costs. It is yet another object of the invention to provide a method that has one or more of the characteristics discussed above but which is relatively simple to set up and operate.

In accordance with a second aspect of the invention, these objects are achieved by providing a method comprising programming an addressable field emitter array; and then producing a spatially modulated electron beam matrix with said addressable field emitter array; and focusing said spatially modulated electron beam matrix with a magnetic lens assembly. In one implementation, the method further comprises reprogramming said addressable field emitter array.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

A clear conception of the advantages and features constituting the present invention, and of the construction and operation of typical mechanisms provided with the present invention, will become more readily apparent by referring to the exemplary, and therefore nonlimiting, embodiments illustrated in the drawings accompanying and forming a part of this specification, wherein like reference numerals designate the same elements in the several views, and in which.

DESCRIPTION OF PREFERRED EMBODIMENTS

Figure 1:
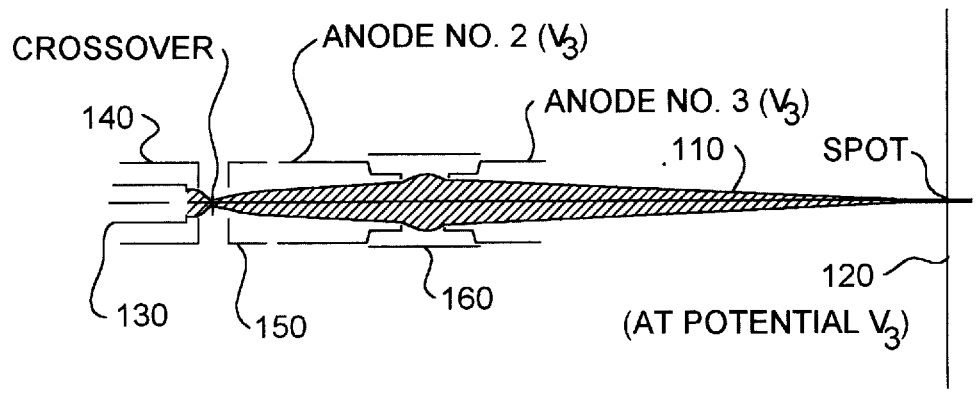
FIG. 1 illustrates a schematic view of a conventional electron gun, appropriately labeled "PRIOR ART"
Figure 2:
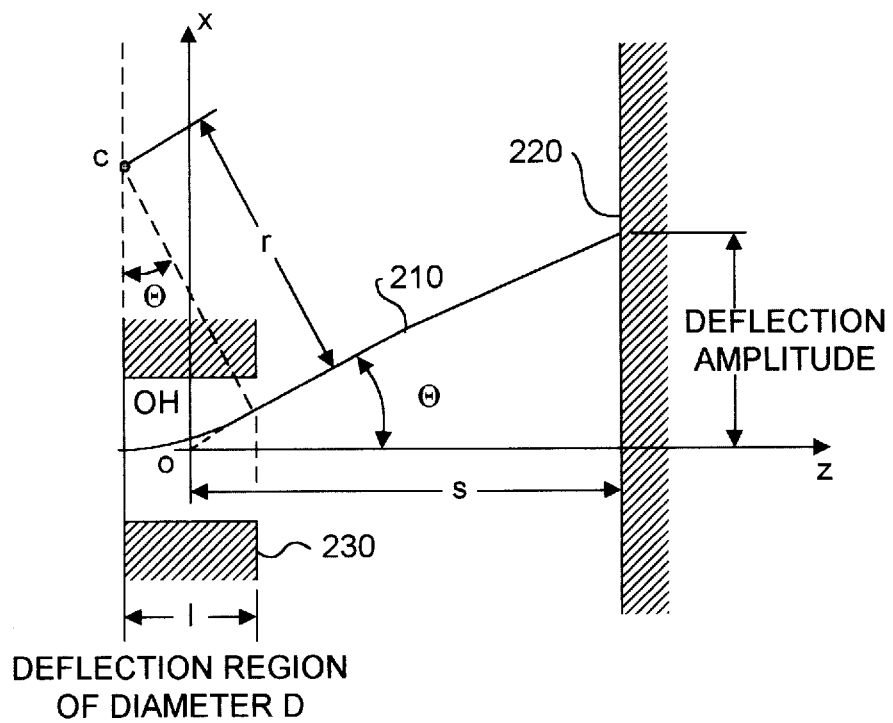
FIG. 2 illustrates a schematic view of a conventional electromagnetic electron beam deflection process, appropriately labeled "PRIOR ART"
Figure 3:
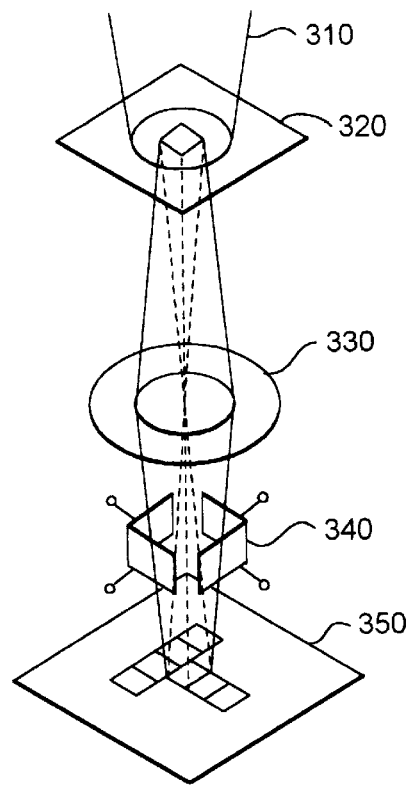
FIG. 3 illustrates a schematic view of a conventional electron resist writing configuration, appropriately labeled "PRIOR ART"

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well known components and processing techniques are omitted so as to not unnecessarily obscure the present invention in detail.

1. System Overview

The above-mentioned requirements of high resolution and fast pattern writing are mutually contradicting and cannot be satisfied simultaneously in the case of a conventional electron beam gun. However, it is rendered possible to simultaneously satisfy these requirements to a certain extent by employing a digital direct write electron beam matrix system according to the present invention in consideration of the fact that the system can include a digitally addressable field emitter array that generates a spatially modulated $\beta$ radiation (i.e., electron) beam matrix that can be used for direct exposure of a circuit patten in an electron resist in a short period of time; without a mask. Significantly, the array is reprogramable so as to permit the reconfiguration of the electron beam matrix in a fraction of a second, thereby making the invention an ideal flexible manufacturing tool.

The following definitions are used throughout the application. An emitter is defined as a potentially electron emitting material, such as diamond-like carbon (DLC). An emitting surface is defined as that surface of an emitter from which electrons are emitted, if an electric field of sufficient strength is present. An emitting array (EA) is defined as an array of emitters. A field emitting array (FEA) is defined as an EA plus a corresponding bias grid. An addressable field emitting array (AFEA) is defined as an FEA plus the supporting integrated circuit (IC) which includes the logic and memory control (LMC). Turning to the electron beams themselves, an array of electron beams is defined as an electron beam matrix (EBM).

2. Detailed Description of Preferred Embodiments

Figure 4:
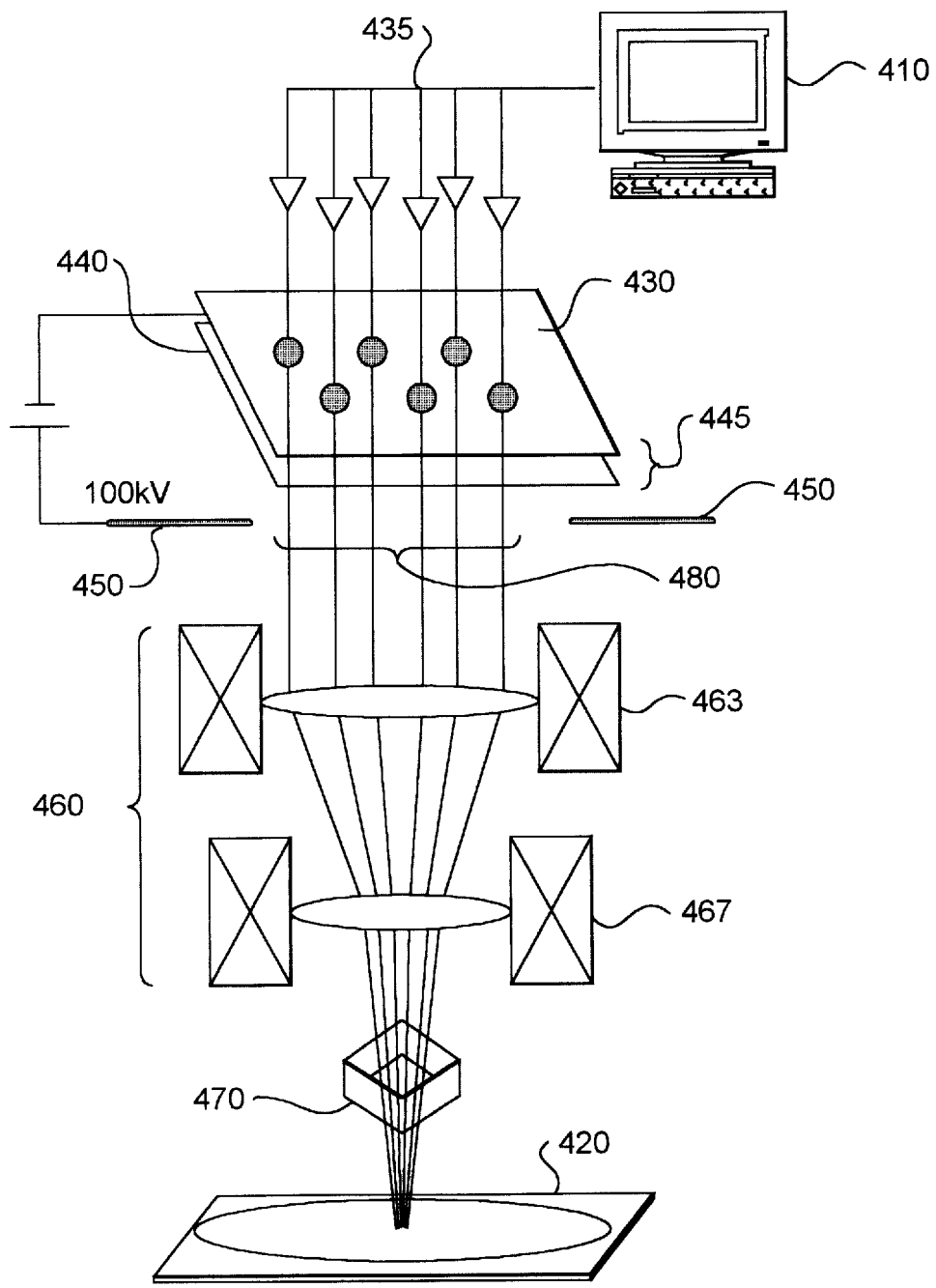
FIG. 4 illustrates a schematic view of a digital direct write electron beam matrix system apparatus according to the present invention.

Referring now to FIG. 4, a digital direct write electron beam matrix lithography system according to the invention has several layers and a remote computer control 410. The system also includes a target wafer 420, which can be precoated with an electron resist.

A first layer of the system includes an emitter array 430 (EA). An emitter array (EA) is a two dimensional array of miniature cathodes used for electron beam sources. The EA 430 can be a close packed emitter array so as to achieve higher information density. The programming-reprogramming of the EA 430 can be achieved through a direct digital computer interface 435 that is connected to the remote computer control 410. A small EA might contain a 10×10 array of field emission devices, each with multiple computer control connections. Programming such a small EA would require less than approximately 10 milliseconds (ms), and a single central processing unit (CPU) can control a plurality of such AFEAs. The individual field emission devices can be made of a coating of diamond-like carbon, or diamond film.

A second layer of the system includes an electrostatic bias grid 440. The electrostatic bias grid 440 can be a metallic layer that is integrally joined with the EA 430. Alternatively, the grid 440 can be a structure that is separate from, but located proximal to, the EA 430. It should be noted that the required turn-on voltage for emission of electrons from diamond-like carbon (or diamond) is on the order of 3 volts per micron. Together, the EA 430 and the grid 440 compose a field emitting array 445 (FEA). The array of electron beams that emanate from FEA 445 can be termed an electron beam matrix 480 (EBM).

A third layer of the system includes an electrostatic accelerator grid 450 which brings the electrons in the EBM up from an energy of a few volts to an energy of from approximately 100 kV to approximately 200 kV. It should be noted that this high energy level advantageously makes the electrons relatively immune to any subsequently encountered focusing errors caused by small stray magnetic and/or electric fields. More specifically, at high energies the electron radius of curvature due to small stray magnetic fields becomes negligible. Further, it should be noted that these high energies also enable the electrons to adequately penetrate the lithographic resist material(s) that are coated on the target wafer 420.

A fourth layer of the system includes a magnetic lens assembly 460 which can image and/or de-magnify the EBM 480 that subsequently impacts onto the target wafer 420. The magnetic lens assembly 460 can include a telecentric magnetic lens system 463 and a correction magnetic lens system 467 which together de-magnify the EBM 480 onto the target wafer 420.

The magnetic lens assembly 460 can be based on a GATAN imaging filter which is a magnetic lens system that is readily commercially available from the GATAN Company of Pleasant, Calif. This imaging filter uses cylindrical magnetic lenses instead of round lenses. Further, this filter causes the electrons to cross-over along a line rather that at a cross-over point. The use of this filter preferably includes the generation of sequential perpendicular line crossovers. The correction lens system 467 can be based on a hexapole (hektupole) corrector lens. The hexapole corrector is to a quadrapole corrector as the quadrapole is to a dipole. The magnetic lens assembly 460 can include coils fabricated from superconducting materials so as to minimize stray fields. Further, the coils can be fabricated from superconducting oxides so that inexpensive liquid nitrogen will provide sufficient cooling for operation of the system.

A fifth layer of the system includes a set of electrostatic deflection plates 470 of nanometer scale deflection. This nanometer scale deflection can be for the purpose of filling-in of write pixels on the surface of the target wafer 420. Therefore, the size of the write pixels can be defined to be larger that the cross section of each individual electron beam at the surface of the target wafer 420. This will allow complete writing of, for example, a 100 nm×100 nm pixel with a 30 nm×30 nm electron beam, with a precision of about 10 nm.

The first layer of the system (the field emitter array) is advantageously positioned within an ultrahigh vacuum (UHV) chamber to minimize damage to the individual field emitter devices from ion bombardment. However, in the case where the individual field emitter devices are made of DLC, they are robust with regard to ion damage and do not require a UHV environment to function. In general, the rest of the layers of the system do not require a UHV environment to function and the balance of the system can be located within a high vacuum chamber. These two chambers can be separated by a flange that includes a plurality of conductive apertures through which the individual electron beams pass. Thus, there can be differential pumping across this flange. These chambers can be part of a pre-existing lithographic stepper into which the invention is retrofitted.

It should be noted that the structures depicted in FIG. 4 are represented in schematic form for improved clarity. Although the embodiment shown in FIG. 4 includes two magnetic lenses, it is within the level of ordinary skill in the art after having knowledge of the invention disclosed herein to provide the system with any type and/or combination of magnetic and/or electrostatic lenses. Further, it is with the level of ordinary skill in the art after having knowledge of the invention disclosed herein to provide the system with any type and/or combination of electrostatic grids and/or deflectors. Similarly, the system can be provided with an optional mask to filter out wider angles.

Figure 5:
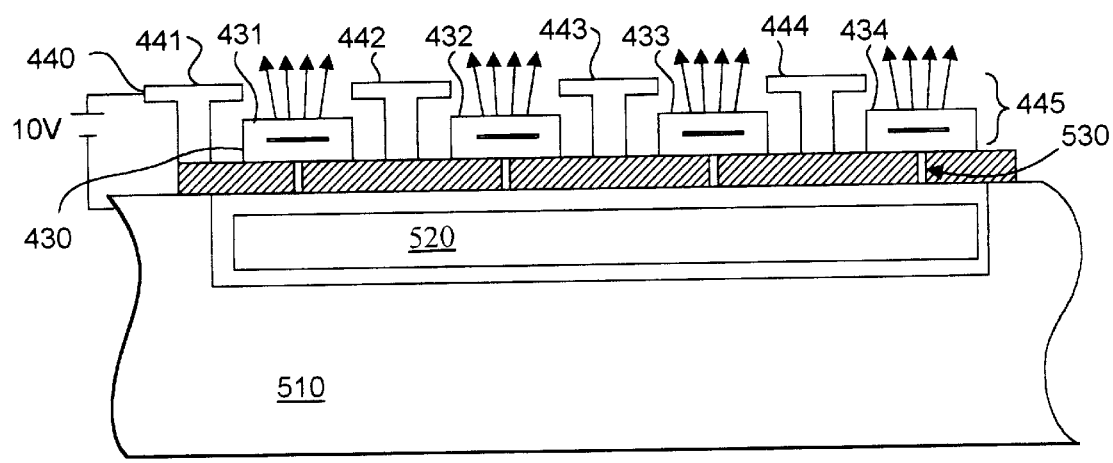
FIG. 5 illustrates a schematic view of a digitally addressable field emitter array according to the present invention.

Referring now to FIG. 5, the FEA 445 which includes the EA 430 and the electrostatic bias grid 440 will be considered in more detail. It will be appreciated that only a portion of the FEA 445 and the EA 430 and grid 440 are shown in FIG. 5. An actual emitter array can contain hundreds, or thousands, or even millions of individual emitters. Similarly, a corresponding bias grid will contain a matched set of openings through which the individual electron beams may pass.

The EA 430 is shown as including a plurality of addressable emitters 431–434 which are capable of emitting electrons from an emitting surface. Of course the EA 430 can include many, many more emitters than just the four that are depicted in FIG. 5. Together, all the emitters define an emitter array (EA). The electrostatic bias grid 440 is shown as including a plurality of grid elements 441–444 which, when biased, are capable of causing the emitters 431–434 to emit electrons. Of course, the bias grid 440 can include many, many more elements. The bias grid 440 is a final metallic layer on the FEA 445 and should have a relatively small capacitance so that it can be biased a few volts positive or negative within a switching time that is on the order of a microsecond, or less (using a modest power supply), thereby turning the overall writing current of the FEA 445 on and/or off. Together, the EA 430 and the bias grid 440 compose the field emitting array 445 that generates the electron beam matrix 480 which is capable of direct writing a lithographic pattern on a semiconductor wafer coated with a suitable electron resist material.

Control of the electron beam matrix 480 is provided in the following manner. Turn-on, or turn-off, of the entire field emitting array 445 is achieved by switching the bias grid 440 from negative to positive, or from positive to negative, respectively. It must be noted now that an individual bias can be applied to each of the emitters 431–434. More specifically, each of the emitters 431–434 is individually addressable through a connection 530 with regard to the bias of that individual emitter. Thus, the individual beam from each emitter cathode is addressable. When the bias grid 440 is "on" (biased positive), emitters that are biased negative relative to the 440 grid will emit. Therefore, the invention permits patterns to be programmed into the FEA 445 before any such pattern is written onto the target wafer 420.

When the FEA 445 is turned on, as a whole by bias grid 440, the individual bias applied to the individual emitters 431–434 that compose the EA 430 will determine whether that particular emitter is programmed to write or not write. If an individual emitter writes then it will emit an electron beam that contributes to the overall electron beam matrix that is emitted from the FEA 445. If an individual emitter does not write, that portion of the matrix will be substantially void of electrons. Thus, each individual emitter being in a write-state, or not-write-state, will determine the configuration of the overall electron beam matrix that is generated from the FEA 445.

The bias grid 440 is, in this example, mechanically connected to the EA 430. Each pixel of the FEA 445 includes an emitter tip and an extraction grid portion that together supply the electrical field needed to initiate the emission of electrons. As noted above, in operation, each emitter will be programmed to write or not write. This can be done by grounding the emitter surface to the grid 440 (not-write-state) or applying a relative negative bias to the emitter surface (write-state) that defines an electric field with regard to the bias grid that is at least sufficient to cause emission of electrons from the emitter surface.

The FEA 445 can be microfabricated as a silicon integrated circuit 510 that contains a logic and memory circuit 520 (LMC). The LMC 520 is needed to individually control each emitter. Together, the FEA 445, the integrated circuit 510 and the LMC 520 compose an addressable field emitting array (AFEA). Preferably, the addressable field emitting array is a digitally addressable field emitting array so as to permit rapid reprogramming.

It should be noted that the emitters and bias grid are represented in FIG. 5 as simple block and T-shaped structures, respectively, for improved clarity. Although the preferred embodiment shown in FIG. 5 includes four block-shaped emitters and four T-shaped grid elements, it is within the level of ordinary skill in the art after having knowledge of the invention disclosed herein to provide an array of any number of emitters, or any suitable configuration. Similarly, it is within the level of ordinary skill in the art after having knowledge of the invention disclosed herein to provide emitters and grid elements of any shape so long as a suitable emitting field is produced.

While not being limited to any particular performance indicator, preferred embodiments of the present invention can be identified one at a time by testing for brightness and low aberration. The test for brightness can be carried out on the field emitting array without undue experimentation by the use of a simple and conventional electron flux detection experiment. The test for low aberration can be carried out on the magnetic lens assembly without undue experimentation by the use of a simple and conventional magnetic field detection experiment.

A practical application of the present invention which has value within the technological arts is writing patterns on electron resists. There are virtually innumerable uses for the present invention described herein, all of which need not be detailed here.

The invention can write simultaneously with millions of electron beams in an easily programmable field emitter array, potentially writing an entire 1 cm×1 cm chip, with 0.1 micron line widths, in a period of time on the order of 1 second. The invention is also scaleable to line widths up to an order of magnitude smaller (i.e., 10 nm). The invention obviates the need for a physical mask during lithographic processing. In addition to rapidly writing large areas, the invention has the advantage of a digitally programmable virtual mask, which can be reprogrammed for new layers within milliseconds, with no moving parts.

All the disclosed embodiments of the invention described herein can be realized and practiced using conventional materials, subcomponents and subcombinatorial procedures without undue experimentation. Although the best mode contemplated by the inventors of carrying out the present invention is disclosed above, practice of the present invention is not limited thereto. It will be manifest that various additions, modifications and rearrangements of the features of the present invention may be made without deviating from the spirit and scope of the underlying inventive concept. Accordingly, it will be appreciated by those skilled in the art that, within the scope of the appended claims, the invention may be practiced otherwise than as specifically described herein.

For example, the electron beam matrix source could be enhanced by providing additional electrostatic grids and/or magnetic lenses and/or deflection plates. Similarly, although diamond-like carbon (DLC) is preferred for the emitting surface, any field emitting material could be used in its place. In addition, the individual components need not be fabricated from the disclosed materials, but could be fabricated from virtually any suitable materials.

Moreover, the individual components need not be formed in the disclosed shapes, or assembled in the disclosed configuration, but could be provided in virtually any shape, and assembled in virtually any configuration, which affect electrons so as to provide an addressable field emitter array. Further, although the addressable field emitter array described herein is a physically separate module, it will be manifest that the array may be integrated into the apparatus with which it is associated. Furthermore, all the disclosed features of each disclosed embodiment can be combined with, or substituted for, the disclosed features of every other disclosed embodiment except where such features are mutually exclusive.

It is intended that the appended claims cover all such additions, modifications and rearrangements. Expedient embodiments of the present invention are differentiated by the appended subclaims.

REFERENCES

1. The Electrical Engineering Handbook, CRC Press, (Richard C. Dorf et al. eds., 1993).
2. Thin Film Processes, Academic Press, Inc., (John L. Vossen et al. eds., 1978).
3. Van Nostrand's Scientific Encyclopedia, 8th ed., Van Nostrand Reinhold, (Douglas M. Considine et al. eds., 1995).

What is claimed is:
1. A digital direct write electron beam lithography system, comprising:
   I) a digitally addressable field emission array including:
      A) a digital computer interface;
      B) a plurality of field emitters electrically connected to said digital computer interface, each of said plurality of individually addressable field emitters having an individual bias; and
      C) an electrostatic bias grid operably connected to said plurality of field emitters;
   II) an electrostatic accelerator grid operably connected to said addressable field emission array;
   III) a magnetic lens assembly operably connected to said electrostatic accelerator grid, said magnetic lens assembly including:
      A) a telecentric magnetic lens system; and
      B) a correction magnetic lens system; and
   IV) a set of electrostatic deflection plates operably connected to said magnetic lens assembly.

2. The apparatus of claim 1, further comprising V) a target wafer electronically coupled to said plurality of individually addressable field emitters through all of said electrostatic accelerator grid, said magnetic lens assembly and said set of electrostatic deflection plates.

3. An apparatus, comprising;
   a digitally addressable field emission array, each of said plurality of individually addressable field emitters having an individual bias;
   an electrostatic accelerator grid operably connected to said addressable field emission array; and
   a magnetic lens assembly operably connected to said addressable field emitter array.

4. The apparatus of claim 3, wherein said digitally addressable field emitter array includes:
   A) a digital computer interface; and
   B) an electrostatic bias grid operably and individually connected to said plurality of individually addressable field emitters,
   wherein said digitally addressable field emission array is electrically coupled to said digital computer interface.

5. The apparatus of claim 3, wherein said magnetic lens assembly includes a telecentric magnetic lens system and a correction lens system.

6. The apparatus of claim 3, further comprising a set of electrostatic deflection plates operably connected to said magnetic lens assembly.

7. The apparatus of claim 3, further comprising a target wafer electronically coupled to said digitally addressable field emitter array.

8. A stepper comprising the apparatus of claim 3.

9. An apparatus comprising:
   means for generating a spatially modulated electron beam matrix, each of said plurality of individually addressable field emitters having an individual bias; and
   means for focusing said spatially modulated electron beam matrix.

10. The apparatus of claim 9, wherein said means for focusing includes means for de-magnifying said electron beam matrix.

11. The apparatus of claim 9, further comprising means for applying an electrostatic field to said spatially modulated electron beam matrix so as to accelerate said spatially modulated electron beam matrix and reduce distortions of said spatially modulated electron beam matrix caused by electromagnetic aberrations generated by said means for focusing.

12. The apparatus of claim 9, further comprising means for applying an electrostatic field to said spatially modulated electron beam matrix so as to deflect said spatially modulated electron beam matrix and permit complete writing of a plurality of pixels by said spatially modulated electron beam matrix.

13. A method, comprising:
   programming a addressable field emitter array, each of said plurality of individually addressable field emitters having an individual bias; and then
   producing a spatially modulated electron beam matrix with said addressable field emitter array; and
   focusing said spatially modulated electron beam matrix with a magnetic lens assembly.

14. The method of claim 13, further comprising accelerating said spatially modulated electron beam matrix with an electrostatic acceleration structure.

15. The method of claim 13, further comprising deflecting said spatially modulated electron beam matrix with an electrostatic deflection structure.

16. The method of claim 13, further comprising writing an electron resist with said spatially modulated electron beam matrix.

17. The method of claim 13, further comprising reprogramming said digitally addressable field emitter array.

18. In a lithographic process, the improvement comprising the method of claim 13.

19. An apparatus for performing the method of claim 13.

20. An apparatus made by the method of claim 13.

* * * * *

UNITED STATES PATENT AND TRADEMARK OFFICE
CERTIFICATE OF CORRECTION

PATENT NO. : 5,892,231
DATED : April 6, 1999
INVENTOR(S) : Larry R. Baylor et al.

It is certified that error appears in the above-identified patent and that said Letters Patent is hereby corrected as shown below:

On the title page,
Please replace the ABSTRACT

ABSTRACT
Systems and methods for direct-to-digital holography are described. An apparatus includes a laser; a beamsplitter optically coupled to the laser; a reference beam mirror optically coupled to the beamsplitter; an object optically coupled to the beamsplitter; a focusing lens optically coupled to both the reference beam mirror and the object; and a digital recorder optically coupled to the focusing lens. A reference beam is incident upon the reference beam mirror at a non-normal angle, and the reference beam and an object beam are focused by the focusing lens at a focal plane of the digital recorder to form an image. The systems and methods provide advantages in that computer assisted holographic measurements can be made.

Insert in place thereof the following Abstract:

--ABSTRACT
--Systems and methods for providing digital direct write electron beam lithography are described. An apparatus includes a digitally addressable field emitter array; an electrostatic accelerator grid operably connected to the addressable field emitter array; and a magnetic lens assembly operably connected to the electrostatic accelerator grid. The systems and methods provide advantages in that a higher resolution pattern is written in a lithographic resist without the need for either scanning or a mask and the electron beam matrix generated by the emitter array be readily reprogrammed, thereby providing an ideal flexible manufacturing tool.--

UNITED STATES PATENT AND TRADEMARK OFFICE
CERTIFICATE OF CORRECTION

PATENT NO. : 5,892,231
DATED : April 6, 1999
INVENTOR(S) : Larry R. Baylor et al.

It is certified that error appears in the above-identified patent and that said Letters Patent is hereby corrected as shown below:

Col. 5, line 36, please replace "reprogramable" with --reprogrammable--.

Signed and Sealed this

First Day of August, 2000

Attest:

Q. TODD DICKINSON

*Attesting Officer*  *Director of Patents and Trademarks*